United States Patent [19]

Forbes et al.

[11] 3,909,925

[45] Oct. 7, 1975

[54] N-CHANNEL CHARGE COUPLED DEVICE FABRICATION PROCESS

[75] Inventors: Leonard Forbes; Jerry R. Yeargan, both of Fayetteville, Ark.

[73] Assignee: Telex Computer Products, Inc., Tulsa, Okla.

[22] Filed: May 6, 1974

[21] Appl. No.: 467,055

[52] U.S. Cl. .................... 29/578; 29/589; 29/591; 357/24

[51] Int. Cl.[2] .................... B01J 17/00

[58] Field of Search .............. 29/571, 577, 578, 589, 29/580, 591; 357/24

[56] References Cited

UNITED STATES PATENTS

| | | | |
|---|---|---|---|
| 3,676,715 | 7/1972 | Brojdo | 357/24 |
| 3,770,988 | 11/1973 | Engeler | 357/24 |
| 3,796,928 | 3/1974 | Doo | 357/24 |
| 3,845,295 | 10/1974 | Williams | 357/24 |

*Primary Examiner*—W. Tupman

[57] ABSTRACT

This abstract describes a process of construction of an N-channel charge coupled device. It provides a step-by-step series of operations which will produce on a P-type substrate of silicon a series of interposed spaced polysilicon gates and aluminum gates. The polysilicon gates are deposited on a thin silicon nitrade layer which is positioned on a thin silicon oxide layer, both of minimum thickness, so there is good capacitive coupling between the polysilicon and the silicon. A thick layer of silicon oxide is formed over the polysilicon gate, after which the nitride layer between the polysilicon gates is etched away. A silicon oxide layer is deposited in the space between the nitride areas and on top of that an aluminum gate is deposited. Conventional means are provided to attach conductor leads to the polysilicon gates. If desired Boron or other elements can be implanted in the silicon before the oxide and aluminum gates are deposited.

9 Claims, 7 Drawing Figures

N-CHANNEL CHARGE COUPLED DEVICE FABRICATION PROCESS

BACKGROUND OF THE INVENTION

This invention lies in the field of integrated circuit manufacture. More particularly, it is in the field of charge coupled devices. Still more particularly, it is concerned with a particular design and construction which affords high capacitance between the polysilicon gate and P-type substrate and high leakage resistance between the aluminum and the polysilicon gates.

In the prior art, in devices of this sort, because of the particular nature of deposited layers of silicon oxide, it has been necessary, in order to provide high leakage resistance, to make these layers of considerable thicknesses. When such a thick layer of oxide is placed between a polysilicon gate and the substrate, the capacitance is too low for satisfactory operation. Furthermore, in order to obtain high capacitance between the aluminum gate and the substrate, it is necessary to provide a thin layer of silicon oxide between the aluminum gate and the substrate and between the polysilicon gate and the substrate. This thin layer may provide insufficiently high resistance between the two gates and the substrate, and between the two gates themselves. In the prior art this layer has been made quite thick in order to obtain the high resistance, in which case the capacitance between the polysilicon gate and the substrate is too low.

SUMMARY OF THE INVENTION

It is a primary object of this invention to provide an integrated circuit charge-coupled device which has high capacitance and high resistance between the polysilicon gates and the substrate and has high capacitance between the aluminum gates and the substrate, or between the aluminum gate and the area of the substrate that is implanted with boron, while maintaining a large thickness of silicon oxide between the polysilicon gate and the aluminum gate.

This and other objects are realized and the limitations of the prior art are overcome in this invention by an improved process of manufacture.

The end result of the process is to provide on the surface of the substrate, a thin layer of silicon oxide; on top of that a thin layer of silicon nitride; on top of that a thick layer of polysilicon. The polysilicon is etched to form a plurality of silicon gates of selected area and spaced along a line. The area of the polysilicon gates is less than the desired areas of insulating layer formed of the nitride and the oxide. There is a thick layer of silicon oxide thermally grown over the polysilicon forming a series of spaced islands of polysilicon covered with silicon oxide. Next, the nitride is etched away between the islands of silicon oxide. A thin oxide layer is thermally grown in the space between the nitride areas after which aluminum is deposited as a conductor, in capacitive relation to the substrate. If desired, prior to growing the silicon oxide, boron or other element can be implanted into the substrate in the space between the polysilicon gates, after which the thin oxide layer is grown and the aluminum layers are deposited. This provides a charge-coupled device with high capacitance between the polysilicon and the substrate and between the aluminum gate and the substrate, with a thick oxide layer between the two gates to maintain high resistance.

BRIEF DESCRIPTION OF THE DRAWINGS

These and other objects of this invention and a better understanding of the principles and details of the invention will be evident from the following description taken in conjunction with the appended drawings in which.

DESCRIPTION OF THE PREFERRED EMBODIMENT

Figure 1:
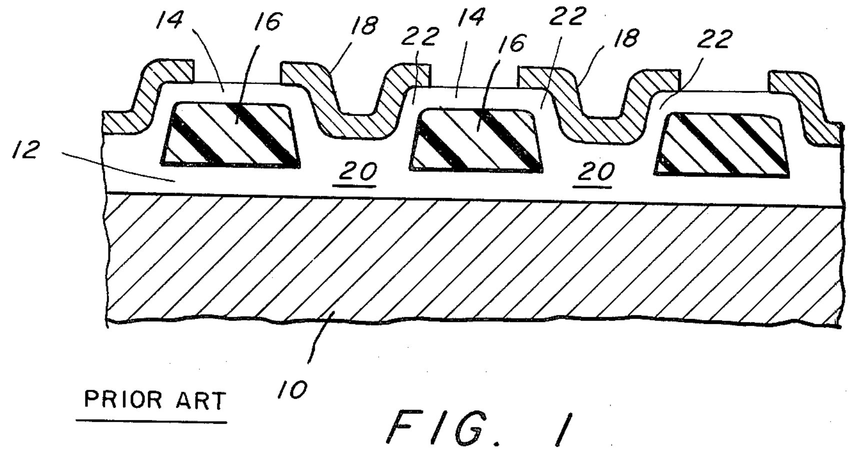
PRIOR ART FIG. 1
FIG. 1 is a view in cross section of the prior art construction.

Referring now to the drawings and in particular to FIG. 1 there is shown a prior art type of charge-control device. This comprises a substrate of silicon 10 with a relatively thick layer 12 of silicon oxide, on which are deposited and etched areas of polysilicon 16, over which is deposited a layer of silicon oxide 14, over which, in the depressed portions 20 is deposited and etched a layer of aluminum 18.

Silicon oxide when deposited in vacuum has a tendency to be somewhat porous, and to have a great number of tiny pin holes. When aluminum is deposited over the oxide the aluminum molecules will progress down through the pinholes and provide connecting paths between the aluminum and the substrate, for example. A similar situation exists when the conducting polysilicon 16 is deposited over a thin layer of oxide, the same conductivity through the pinholes is observed. To overcome this tendency to provide thin leakage filaments, the layers of silicon such as 12 and 14 are made quite thick. However, the capacitance between the polysilicon gates 16 and the substrate is small, and therefore it requires large voltages to provide charge-coupled action in the substrate. The same low capacitance exists between the aluminum gate 18 and the substrate, because of the large thickness of oxide in the space 20 between the aluminum gate 18 and the substrate 10.

This difficulty with existing designs of charge-coupled devices has required the setting up of rather strict design considerations, such as the following:

1. Requirement of high substrate resistivity for drift-aiding fringing fields and good performance characteristics with low voltages and large dimensions.

2. The field region must be accumulated to avoid surface generation currents. This requires high field oxide threshold voltage to avoid reliability problems. On a high resistivity substrate these are most easily achieved by an ion implanted field region.

3. Require good dielectric isolation between the overlapping gate structures. It is highly desirable that this dielectric be thicker than the gate dielectrics employed.

4. It is desirable to have a minimum number of phases for facilitating implementation of charge-coupled devices in memory systems. For two phase structures this requires assymmetry in threshold voltages of gate structures. It also requires one gate structure to give enhancement mode devices. High resistivity substrate requires ion implantation for threshold voltage adjustment to make enhancement mode devices.

5. Compatability with later extension to implanted barrier charge-coupled devices if desirable.

6. Metal gate structures for N-channel devices should be PSG stabilized. Silicon gate structures should employ composite oxide-nitride structure for stabilization of N-channel devices.

FIGS. 2, 3, 4, 5 and 6 indicate the various stages in the preparation of the improved charge-coupled devices of this invention.

Figure 2:
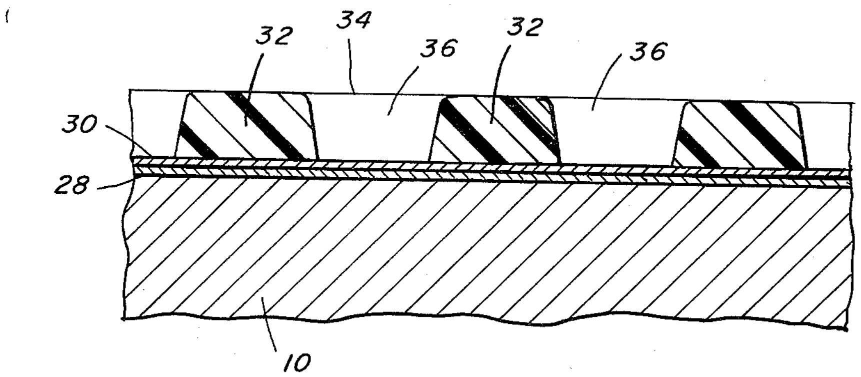
FIGS. 2, 3, 4 and 5 represent in cross section successive steps in the manufacture of the improved device of this invention.

As shown in FIG. 2 the substrate 10 is first coated with a thin layer 28 of silicon oxide. Next, there is applied a thin layer of silicon nitride. Both of these layers, which will be called a first layer of silicon oxide and a second layer of silicon nitride, are of the order of 300 ± 30 Angstrom units thick. On top of the second layer is deposted a thicker third layer 34 of polycrystaline silicon (polysilicon). After deposition, this third payer is masked and etched in the form of isolated areas 32 spaced apart a selected distance along a line. In other words the material 36 is etched away leaving the isolated islands 32 of polysilicon, of thickness from 5000 to 8000 Angstrom units.

Figure 3:
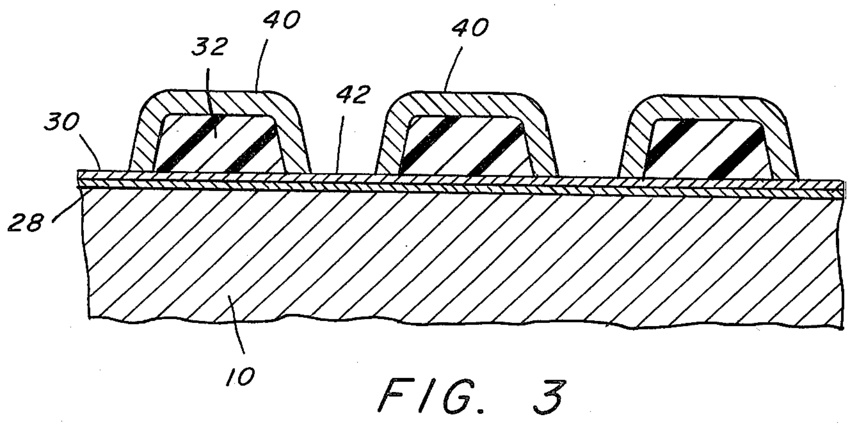
Figure 4:
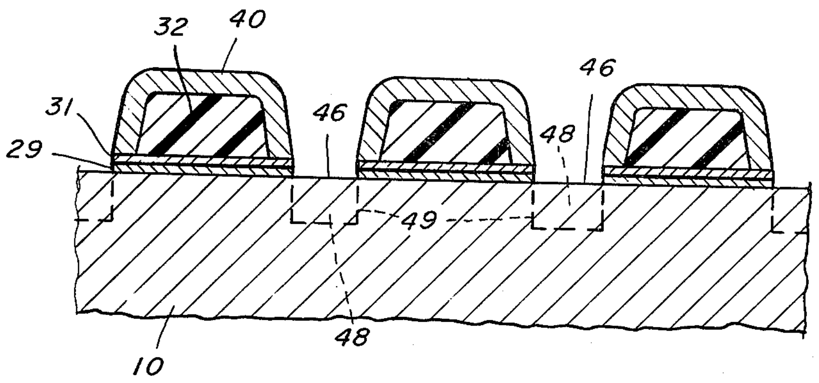

Next, as shown in FIG. 3 there is a thick layer 40 of silicon oxide thermally grown on top of the islands of polysilicon 32. Because of the particular nature of the nitride layer 30, there will be no growth in the inter-island space 42 so that the thick layer of oxide 40 will just cover the island 32. This layer of silicon will be called the fourth layer and is generally of a thickness of 3,000 to 5,000 Angstrom units.

The next step is to etch away the nitride layer 30 in the spaces between the covered islands 32, 40 and to etch away the oxide layer 28 in the same spaces. At this time, if desired, the volumes 48 indicated by dash line, can be implanted with boron, or other selected element as is well known in the art. Because of the sharp clean edges of the nitride layers 31, the substrate in the areas 48 can be implanted by beam means to provide clean vertical edges 49.

Figure 5:
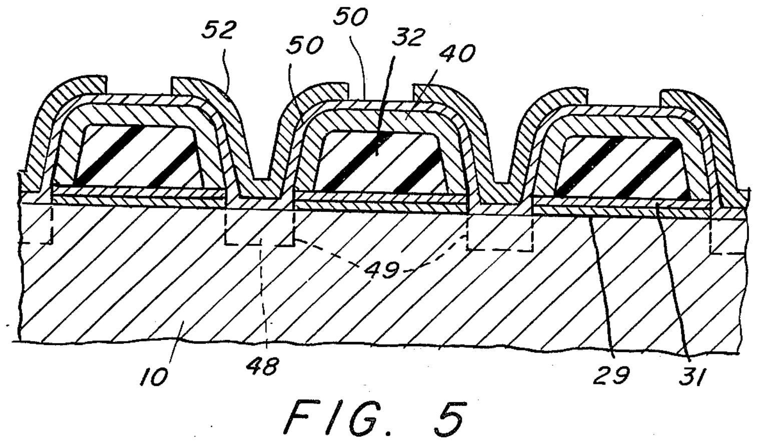
Figure 6:
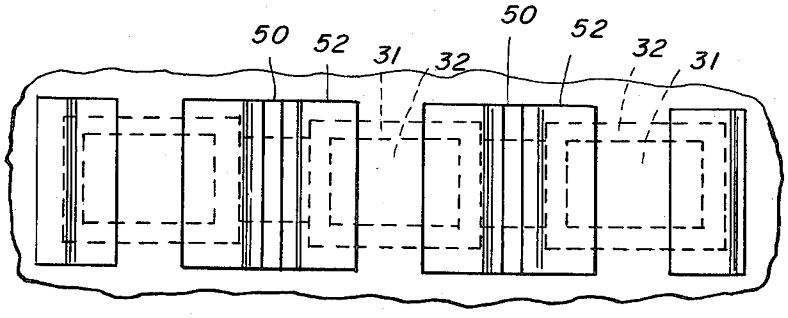
FIG. 6 is a plan view of the device as shown in FIG. 5.

Next, as indicated in FIG. 5, there is a thin fifth layer 50 of silicon oxide grown over the islands 32, 40 and over the inter-island space 46. This fifth layer of oxide 50 is of the order of 1,000 Angstrom units thick. This fifth layer covers the entire surface of the island and the inter-island space. Thereafter, a sixth layer of aluminum is deposited over the entire surface and is then etched away to leave the partial coverings 52 which are called the metal gates, or aluminum gates or transfer gates, corresponding to the islands of polysilicon which are called the silicon gates, or polysilicon gates.

Figure 7:
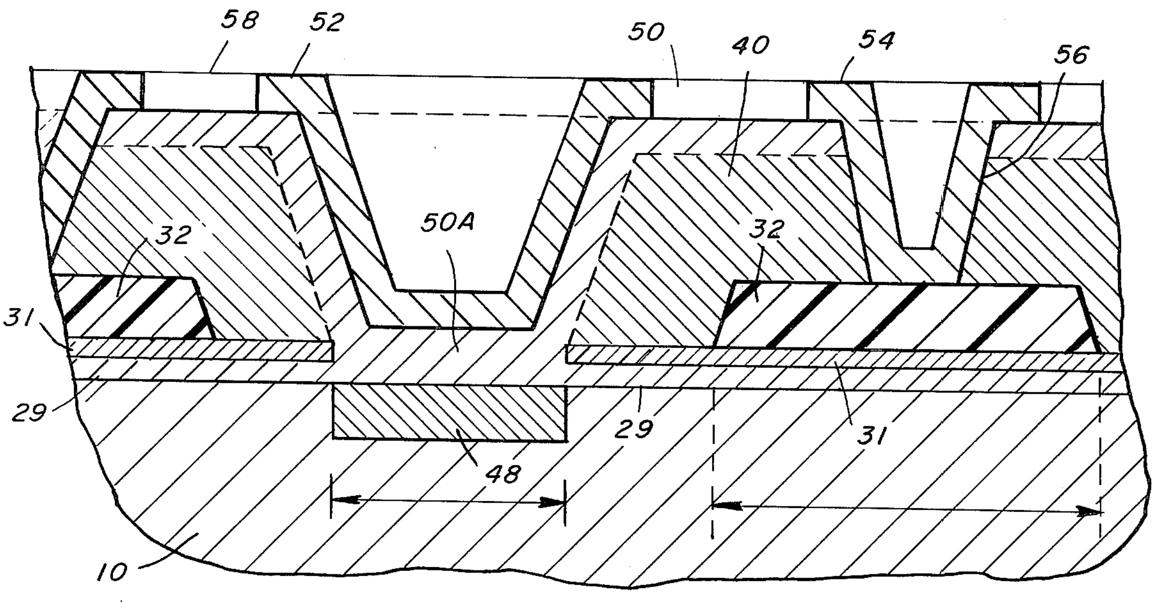
FIG. 7 is an enlarged view of the improved construction.

As is shown in FIG. 7, a portion of the silicon oxide covering of the fourth and fifth layers is etched away 56, after masking, down to the surface of the polysilicon third layer, and the sixth layer of aluminum is simultaneously deposited in those etched away regions to provide the conductive connections 54 to the polysilicon gates. The aluminum layer 52 is then etched away by proper masking, leaving the gates 52 and 54, and providing also, interconnections between the various gates 52 and 54 along the upper surface of the fifth layer 50. The design shown in FIGS. 5 and 6 has particular advantages. Because of the thin insulating layers 29 and 31 the capacitance between the polysilicon gates 32 and the substrate 10 is very high and because of the dense nature high dielectric constant and mechanical strength of the silicon nitride, there are no pin holes and the resistance is very high. The boundaries between the insulating layers 31 and 29 forming parts of each of the islands, are quite sharp since it is etched. This makes it possible for ion implantation into the substrate over areas almost identically shaped to the area of the inter-island spaces.

The fifth layer combined with the fourth layer of silicon oxide provides very high resistance between the metal gate 52 and the polysilicon gate 32. However, because of the particular design sequence, the thickness of the layer 50A (FIG. 7) between the aluminum gates 52 and the boron implanted areas 48 can be as thin as desired, and consequently can be much thinner than the combined thickness of the layers 40 and 50. Thus, there is high capacitance between the aluminum gates and the implanted areas 48, while still maintaining very high resistance between the polysilicon and aluminum gates. Thus, the resulting product shown in FIG. 7 satisfies the design requirements mentioned earlier.

Each of the steps discussed in the preceding description of the FIGURES is well known in the art, and need not be described in great detail. However, they have been discussed rather simply and it appears desirable to describe these various processes in greater detail so as to better describe specifically the type of action required in preparing and carrying out each of the steps. The following steps are normally provided and, in the following list each step and some brief discussion of its purpose are given. However, this list is not necessarily a precise list of what is covered by this invention and the scope of the invention is, of course, to be limited by the scope of the claim or claims. This following list is for more detailed information regarding the manner of carrying out the steps which will be claimed.

SEQUENCE OF STEPS

| | STEP | PURPOSE |
|---|---|---|
| 1. | 300 A° Thermal $SiO_2$ | Prevent stress between $Si_3N_4$ and silicon. |
| 2. | 300 A° CVD $Si_3N_4$ | Oxidation and diffìcusion mask (see latter, local oxidation) |
| 3. | 5000 A° CVD $SiO_2$ | Diffusion mask, ion mask, and etch mask for nitride. |
| 4. | S/D Mask & Photoresist | Define source-drain areas. |
| 5. | Etch $SiO_2$ and strip photoresist | $SiO_2$ acts as etch mask for nitride. |
| 6. | Etch $Si_3N_4$ | |
| 7. | Etch $SiO_2$ | No mask. |
| 8. | S/D phosphorous deposition | Initial drive-in to avoid later dilution & high sheet resistivity. |
| 9. | S/D reoxidation | |
| 10. | Gate Mask and photoresist | Protect gate region and expose field regions. |

–Continued

SEQUENCE OF STEPS

| | STEP | PURPOSE |
|---|---|---|
| 11. | Etch 5000 A° oxide over field | Note also exposes S/D. |
| 12. | Field ion implantation and strip photoresist | Photoresist and thick insulators protect gate regions. |
| 13. | Etch nitride | Glass acts as etch mask. |
| 14. | Etch thick 5000 A° glass | |
| 15. | Field reoxidation Nitride prevents oxidation in gate area, local oxidation | Diffuses the field implant and forms thick field oxide to guarantee high field oxide threshold voltage. |
| 16. | Silicon Gate Deposition | |
| 17. | Si Gate reoxidation | For Si Gate etch mask. |
| 18. | Silicon Gate Mask | Definite polysilicon gate shapes. |
| 19. | Etch $SiO_2$ over polysilicon Etch silicon gate | |
| 20. | Silicon gate reoxidation | Forms insulator between overlapping gate structures and multiple level wiring. |
| 21. | Nitride etch Etch thin 300 A° oxide | Removes nitride where exposed between silicon gates. |
| 22. | Gate reoxidation | |
| 23. | Polysilicon gate deposition | |
| 24. | Ion implantation and anneal | Adjust threshold voltage of thin oxide metal gate devices. |
| 25. | Contact mask and photoresist | Metal to polysilicon gates and metal to S/D. |
| 26. | Aluminum evaporation | |
| 27. | Aluminum anneal | |
| 28. | Aluminum etch | |

While the invention has been described with a certain degree of particularity it is manifest that many changes may be made in the details of construction and the arrangement of components. It is understood that the invention is not to be limited to the specific embodiments set forth herein by way of exemplifying the invention, but the invention is to be limited only by the scope of the attached claim or claims, including the full range of equivalency to which each element or step thereof is entitled.

What is claimed is:

1. In the process of making a semi-conductor charge coupled device in which a metal transfer gate is positioned in the space between two spaced-apart silicon storage gates, the improvement comprising the steps of a. preparing a chip of silicon semi-conductor;
b. forming a thin continuous first layer of silicon dioxide on top of said chip;
c. forming a thin continuous second layer of silicon nitride on top of said first layer;
d. forming a thick layer of polycrystalline silicon (polysilicon) on top of said second layer, said third layer being etched in the shape of spaced rectangular areas of selected size and spacing;
e. forming a thick fourth layer of silicon dioxide completely covering all exposed areas of said third layer;
f. etching away said second silicon nitride layer between said areas of silicon dioxide coated polysilicon;
g. forming a thin fifth layer of silicon oxide over said areas of silicon dioxide coated polysilicon and over the space between said areas;
h. depositing a sixth metal layer over said fifth layer in the space between said spaced apart areas of said fourth layer; and
i. providing conductor means to contact said areas of said third layer.

2. The method as in claim 1 in which said first layer is of a thickness in the range of 300 plus or minus 50 Angstrom units.

3. The method as in claim 1 in which said second layer is of a thickness in the range of 300 plus or minus 50 Angstrom units.

4. The method as in claim 1 in which said third layer is of a thickness in the range of 5,000 to 8,000 Angstrom units.

5. The method as in claim 1 in which said fourth layer is of a thickness in the range of 3,000 to 5,000 Angstrom units.

6. The method as in claim 1 in which said fifth silicon dioxide layer is of a thickness in the range of 1,000 to 2,000 Angstrom units.

7. The method as in claim 1 in which the lateral dimension of said fifth layer is of the range of five plus or minus one micron.

8. The method as in claim 1 in which the lateral dimension of said areas of said third layer is of the range of 10 plus or minus 1 micron.

9. The method as in claim 1 in which the thickness of said sixth layer is in the range of 1 plus or minus 0.1 micron.

* * * * *